(12) United States Patent
Kamakura et al.

(10) Patent No.: US 9,028,648 B1
(45) Date of Patent: May 12, 2015

(54) SUBSTRATE PROCESSING APPARATUS, METHOD OF MANUFACTURING SEMICONDUCTOR DEVICE AND NON-TRANSITORY COMPUTER-READABLE RECORDING MEDIUM

(71) Applicant: Hitachi Kokusai Electric Inc., Tokyo (JP)

(72) Inventors: Tsukasa Kamakura, Toyama (JP); Kenji Kameda, Toyama (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 0 days.

(21) Appl. No.: 14/493,828

(22) Filed: Sep. 23, 2014

(30) Foreign Application Priority Data

Mar. 26, 2014 (JP) .................................. 2014-063076

(51) Int. Cl.
| | | |
|---|---|---|
| *C23C 16/44* | (2006.01) | |
| *C23C 16/458* | (2006.01) | |
| *C23C 16/52* | (2006.01) | |
| *H01L 21/00* | (2006.01) | |
| *H01L 21/02* | (2006.01) | |

(52) U.S. Cl.
CPC ......... *C23C 16/4405* (2013.01); *C23C 16/4586* (2013.01); *C23C 16/52* (2013.01); *C23C 16/4412* (2013.01); *H01L 21/02104* (2013.01)

(58) Field of Classification Search
CPC C23C 16/4405; C23C 16/52; C23C 16/4586; C23C 16/4412; H01L 21/02104
USPC .......................... 118/715; 156/345.29, 345.33
See application file for complete search history.

(56) References Cited

U.S. PATENT DOCUMENTS

| | | | | |
|---|---|---|---|---|
| 5,849,092 A | * | 12/1998 | Xi et al. ......................... | 134/1.1 |
| 5,939,831 A | * | 8/1999 | Fong et al. ............... | 315/111.21 |
| 6,402,847 B1 | * | 6/2002 | Takagi et al. ................. | 118/715 |
| 6,432,256 B1 | * | 8/2002 | Raoux ......................... | 156/345.1 |
| 7,037,376 B2 | * | 5/2006 | Harvey et al. ................. | 118/715 |
| 7,954,452 B2 | * | 6/2011 | Okabe et al. .................. | 118/697 |
| 8,282,768 B1 | * | 10/2012 | Smargiassi et al. ...... | 156/345.33 |
| 8,911,553 B2 | * | 12/2014 | Baluja et al. .................. | 118/715 |
| 2002/0007790 A1 | * | 1/2002 | Park ............................. | 118/715 |
| 2002/0017244 A1 | * | 2/2002 | Sillmon et al. ............... | 118/715 |
| 2004/0020599 A1 | * | 2/2004 | Tanaka et al. ............ | 156/345.29 |
| 2004/0071874 A1 | * | 4/2004 | Shimizu et al. ............ | 427/248.1 |
| 2005/0230350 A1 | * | 10/2005 | Kao et al. ........................ | 216/67 |

(Continued)

FOREIGN PATENT DOCUMENTS

| | | |
|---|---|---|
| JP | 2004-211168 A | 7/2004 |
| JP | 2005-109194 A | 4/2005 |

*Primary Examiner* — Jeffrie R Lund
(74) *Attorney, Agent, or Firm* — Volpe and Koenig, P.C.

(57) ABSTRACT

Provided are a substrate processing apparatus and a method of manufacturing a semiconductor device, which perform a cleaning process on the inside of an exhaust buffer chamber even if gases are exhausted using the exhaust buffer chamber. The substrate processing apparatus includes a processing space to process a substrate on a substrate placing surface, a gas supply system to supply gases into the processing space through a side facing the substrate placing surface, an exhaust buffer chamber including a communication hole communicating with the processing space at least at a side portion of the processing space and a gas flow blocking wall extending in a blocking direction of the gases flowing through the communication hole, a gas exhaust system configured to exhaust the gases supplied into the exhaust buffer chamber, and a cleaning gas supply pipe configured to supply a cleaning gas into the exhaust buffer chamber.

18 Claims, 6 Drawing Sheets

(56) References Cited

U.S. PATENT DOCUMENTS

| | | | |
|---|---|---|---|
| 2006/0219169 A1* | 10/2006 | Chen et al. | 118/715 |
| 2006/0286774 A1* | 12/2006 | Singh et al. | 438/478 |
| 2006/0286776 A1* | 12/2006 | Ranish et al. | 438/478 |
| 2007/0256635 A1* | 11/2007 | Bour et al. | 118/715 |
| 2009/0194233 A1* | 8/2009 | Tamura et al. | 156/345.1 |
| 2012/0090691 A1* | 4/2012 | Baluja et al. | 137/13 |
| 2012/0132618 A1* | 5/2012 | Baluja et al. | 216/66 |
| 2013/0298940 A1* | 11/2013 | Smargiassi et al. | 134/1 |

* cited by examiner

SUBSTRATE PROCESSING APPARATUS, METHOD OF MANUFACTURING SEMICONDUCTOR DEVICE AND NON-TRANSITORY COMPUTER-READABLE RECORDING MEDIUM

CROSS-REFERENCE TO RELATED PATENT APPLICATION

This U.S. non-provisional patent application claims priority under 35 U.S.C. §119 of Japanese Patent Application No. 2014-063076, filed on Mar. 26, 2014, in the Japanese Patent Office, the entire contents of which are hereby incorporated by reference.

BACKGROUND OF THE INVENTION

1. Field of the Invention

The present invention relates to a substrate processing apparatus, a method of manufacturing a semiconductor device and a non-transitory computer-readable recording medium.

2. Description of the Related Art

In general, a substrate processing apparatus for performing processes (e.g., a film forming process) on a substrate (e.g., a wafer) is used in a process of manufacturing a semiconductor device. With the scaling-up of a substrate or an increase in the precision of processes, a single-wafer-type substrate processing apparatus configured to process substrates one by one has widely been used as the substrate processing apparatus.

As a process performed by the single-wafer-type substrate processing apparatus, there is, for example, a film forming process using an alternate supply method. An alternate supply process includes forming a film on a substrate in a processing space by repetitively performing a cycle including a source gas supply process, a purge process, a reactive gas supply process and a purge process a predetermined number of times (n cycles) on the substrate. Accordingly, to efficiently perform the alternate supply process, it is necessary to unite a process of uniformly supplying gases onto the substrate in the processing space with a process of rapidly exhausting the remnant gases from the processing space. Thus, some single-wafer-type substrate processing apparatuses are configured to supply a process gas into a processing space through an upper side via a shower head serving as a gas dispersion mechanism, and discharge gases from the center of a substrate toward an outer circumferential side (i.e., a side portion of the processing space) of the substrate via an exhaust buffer chamber which is installed to surround an outer circumference of the side portion of the processing space and has a downstream side connected to an exhaust pipe.

These substrate processing apparatuses need to periodically remove unnecessary films (reaction byproducts, etc.) adhered to the shower head or the processing space. Therefore, in some single-wafer-type substrate processing apparatuses, a cleaning process is performed on a processing space by supplying a cleaning gas into the processing space via a shower head (for example, refer to Patent document 1). In addition, in other substrate processing apparatuses, a cleaning gas is directly supplied into an exhaust pipe disposed at a downstream side of a processing space in a gas exhaust direction to perform a cleaning process on the exhaust pipe which is a point to which byproducts are easily adhered and from which removing the byproducts is difficult (for example, refer to Patent document 2).

1. Japanese Patent Laid-open No. 2005-109194
2. Japanese Patent Laid-open No. 2004-211168

SUMMARY OF THE INVENTION

However, according to the above-described conventional arts, a cleaning process may not be sufficiently or satisfactorily performed on an exhaust buffer chamber.

For example, when an alternate supply process is performed on a substrate, a source gas and a reactive gas are alternately supplied into a processing space as described above. In this case, there may be cases in which any one gas remains in the exhaust buffer chamber to cause an unintentional reaction in the exhaust buffer chamber. When the unintentional reaction occurs, unnecessary films or byproducts are adhered to an inner wall of the exhaust buffer chamber. In particular, since the inside of the exhaust buffer chamber is not under temperature or pressure conditions for forming a good film unlike the inside of the processing space, a film having poor characteristics (i.e., a film having a deviation in film density or film thickness) is formed. Since the poor film is easily delaminated due to a pressure variation during a switch of the supply of gases, the delaminated film may intrude into the processing space, adversely affect characteristics of a film formed on the substrate, and cause a reduction in yield.

It is inferred that adhered materials may be removed by supplying a cleaning gas via a shower head. However, since an active cleaning gas is deactivated in the processing space before the active cleaning gas reaches the exhaust buffer chamber, the inside of the exhaust buffer chamber may not be sufficiently cleaned. Also, even if the cleaning gas is directly supplied into an exhaust pipe, the exhaust buffer chamber disposed at an upstream side of the exhaust pipe may not be sufficiently cleaned.

To sufficiently perform a cleaning process on the inside of the exhaust buffer chamber, it is inferred that adhered materials may be removed by an operator's handwork during maintenance of an apparatus. However, in this case, a downtime sharply increases, thereby lowering operational efficiency of the apparatus. That is, it is difficult to conclude that a cleaning process may be satisfactorily performed on the inside of the exhaust buffer chamber.

It is a main object of the present invention to provide a substrate processing apparatus and a method of manufacturing a semiconductor device, which may sufficiently and satisfactorily perform a cleaning process on the inside of an exhaust buffer chamber even if a gas exhaust process is performed using the exhaust buffer chamber.

According to one aspect of the present invention, there is provided a substrate processing apparatus including: a processing space configured to process a substrate placed on a substrate placing surface; a gas supply system configured to supply gases into the processing space through a side facing the substrate placing surface; an exhaust buffer chamber including a communication hole communicating with the processing space at least at a side portion of the processing space and a gas flow blocking wall extending in a blocking direction of the gases flowing through the communication hole; a gas exhaust system configured to exhaust the gases supplied into the exhaust buffer chamber; and a cleaning gas supply pipe configured to supply a cleaning gas into the exhaust buffer chamber through a connection point installed between the communication hole and the gas flow blocking wall.

According to another aspect of the present invention, there is provided a method of manufacturing a semiconductor device, including: (a) processing a substrate placed on a substrate placing surface in a processing space by supplying gases onto the substrate in the processing space through a side facing the substrate placing surface while exhausting the gases from the processing space using an exhaust buffer chamber including a space surrounding an outer circumference of a side portion of the processing space; and (b) cleaning the inside of the exhaust buffer chamber by supplying a cleaning gas into the exhaust buffer chamber through a cleaning gas supply pipe communicating with the space of the exhaust buffer chamber.

DETAILED DESCRIPTION OF THE PREFERRED EMBODIMENTS

One Embodiment of the Present Invention

One embodiment of the present invention will now be described with reference to the accompanying drawings.

(1) Structure of Substrate Processing Apparatus

A substrate processing apparatus according to the present embodiment is configured as a single-wafer-type substrate processing apparatus for processing substrates serving as processing objects one by one. As the substrates serving as the processing objects, for example, there may be a semiconductor wafer substrate (hereinafter, referred to simply as a "wafer") on which a semiconductor device is manufactured. Although processes performed on a substrate may include an etching process, an ashing process and a film forming process, particularly, the film forming process will be described in the present embodiment. As a typical example of the film forming process, there is an alternate supply process.

Figure 1:
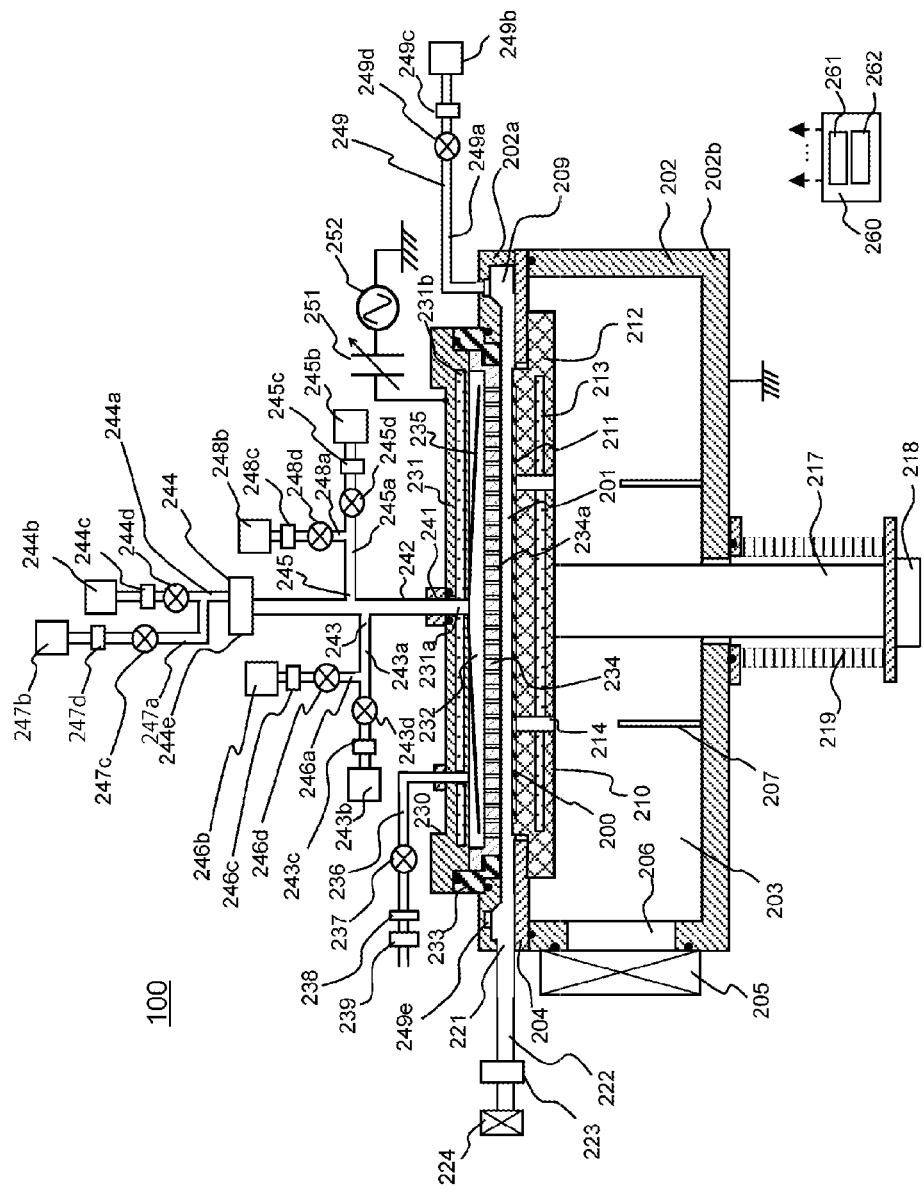
FIG. 1 is a schematic construction view of a single-wafer-type substrate processing apparatus according to an exemplary embodiment of the present invention.

Hereinafter, a structure of a substrate processing apparatus according to the present embodiment will be described with reference to FIG. 1. FIG. 1 is a schematic construction diagram of a single-wafer-type substrate processing apparatus according to the present embodiment.

(Process Container)

As illustrated in FIG. 1, a substrate processing apparatus 100 includes a process container 202. The process container 202 is configured as, for example, a planar airtight container having a circular cross-section. Also, the process container 202 is formed of a metal material, for example, aluminum (Al) or stainless steel (SUS). A processing space 201 for processing a wafer 200 (e.g., silicon wafer) serving as a substrate and a transfer space 203 through which the wafer 200 passes when the wafer 200 is transferred to the processing space 201 are formed in the process container 202. The process container 202 includes an upper container 202a and a lower container 202b. A partition plate 204 is installed between the upper container 202a and the lower container 202b.

An exhaust buffer chamber 209 is installed near a peripheral edge of an outer circumference of the inside of the upper container 202a (upper container 202a). The exhaust buffer chamber 209 will be described in detail below.

A substrate loading/unloading port 206 is installed in a side surface of the lower container 202b and adjacent to a gate valve 205, and the wafer 200 is transferred between the lower container 202b and a transfer chamber (not shown) via the substrate loading/unloading port 206. A plurality of lift pins 207 are installed on a bottom portion of the lower container 202b. Also, the lower container 202b is grounded.

(Substrate Support Unit)

A substrate support unit 210 for supporting the wafer 200 is installed in the processing space 201. The substrate support unit 210 mainly includes a substrate placing surface 211 for placing the wafer 200, a substrate placing table 212 having the substrate placing surface 211 disposed on a surface thereof, and a heater 213 embedded in the substrate placing table 212 and serving as a heating source. Through holes 214 through which the lift pins 207 pass are respectively installed in positions corresponding to the lift pins 207.

The substrate placing table 212 is supported by a shaft 217. The shaft 217 penetrates a bottom portion of the process container 202 and is connected to an elevating mechanism 218 outside the process container 202. By lowering/elevating the shaft 217 and the substrate placing table 212 by operating the elevating mechanism 218, the wafer 200 placed on the substrate placing surface 211 may be lowered/elevated. Also, the circumference of a lower end portion of the shaft 217 is coated with a bellows 219, and the inside of the process container 202 is air-tightly retained.

The substrate placing table 212 is lowered during the transfer of the wafer 200 until the substrate placing surface 211 is in a position (wafer transfer position) opposite to the substrate loading/unloading port 206. During the processing of the wafer 200, the substrate placing table 212 is elevated until the wafer 200 is in a process position (wafer process position) of the processing space 201 as shown in FIG. 1. Specifically, when the substrate placing table 212 is lowered to the wafer transfer position, upper end portions of the lift pins 207 protrude from a top surface of the substrate placing surface 211 so that the lift pins 207 can support the wafer 200 from below. Also, when the substrate placing table 212 is elevated to the wafer process position, the lift pins 207 are buried from the top surface of the substrate placing surface 211 so that the substrate placing surface 211 can support the wafer 200 from below. Also, since the lift pins 207 are in direct contact with the wafer 200, the lift pins 207 are preferably formed of a material, for example, quartz or alumina.

(Shower Head)

A shower head 230 is installed in an upper portion of the processing space 201 (at an upstream side in a gas supply direction) and serves as a gas dispersion mechanism. A gas introduction port 241 is installed at a lid 231 of the shower head 230, and a gas supply system which will be described below is connected to the gas introduction port 241. Gases introduced through the gas introduction port 241 are supplied to a buffer space 232 of the shower head 230.

The lid 231 of the shower head 230 is formed of a conductive metal and used as an electrode for generating plasma in the buffer space 232 or in the processing space 201. An insulating block 233 is installed between the lid 231 and the upper container 202a and electrically insulates the lid 231 from the upper container 202a.

The shower head 230 includes a dispersion plate 234 for dispersing gases supplied via the gas introduction port 241 through the gas supply system. An upstream side of the dispersion plate 234 is the buffer space 232, and a downstream side thereof is the processing space 201. A plurality of through holes 234a are installed in the dispersion plate 234. The dispersion plate 234 faces the substrate placing surface 211.

A gas guide 235 for forming the flow of supplied gases is installed in the buffer space 232. The gas guide 235 has a circular conic shape having the gas introduction port 241 as an apex, and the diameter of the gas guide 235 increases toward the dispersion plate 234. A lower end of the gas guide 235 is formed further outward from a group of the through holes 234a formed at an outermost circumferential side of the dispersion plate 234.

(Plasma Generation Unit)

A matcher 251 and a radio-frequency (RF) power source 252 are connected to the lid 231 of the shower head 230. By adjusting an impedance using the RF power source 252 and the matcher 251, plasma is generated in the shower head 230 and the processing space 201.

(Gas Supply System)

A common gas supply pipe 242 is connected to the gas introduction port 241 installed at the lid 231 of the shower head 230. The common gas supply pipe 242 is connected to the gas introduction port 241 and communicates with the buffer space 232 in the shower head 230. A first gas supply pipe 243a, a second gas supply pipe 244a and a third gas supply pipe 245a are connected to the common gas supply pipe 242. The second gas supply pipe 244a is connected to the common gas supply pipe 242 via a remote plasma unit (RPU) 244e.

A source gas is mainly supplied through a source gas supply system 243 including the first gas supply pipe 243a, and a reactive gas is mainly supplied through a reactive gas supply system 244 including the second gas supply pipe 244a. An inert gas is mainly supplied when the wafer 200 is processed using a purge gas supply system 245 including the third gas supply pipe 245a, and a cleaning gas is mainly supplied when the shower head 230 or the processing space 201 is cleaned. Among gases supplied through the gas supply system, the source gas may be referred to as a first gas, the reactive gas may be referred to as a second gas, the inert gas may be referred to as a third gas, and the cleaning gas [for the processing space 201] may be referred to as a fourth gas. Also, a cleaning gas [for the exhaust buffer chamber 209] supplied by an exhaust buffer chamber cleaning gas supply system which will be described below, which is one of the gas supply systems, may be referred to as a fifth gas.

(Source Gas Supply System)

A source gas supply source 243b, a mass flow controller (MFC) 243c which is a flow rate control device (flow rate control unit), and a valve 243d which is an opening/closing valve are sequentially installed at the first gas supply pipe 243a in an upstream direction. Also, a source gas is supplied through the first gas supply pipe 243a via the MFC 243c, the valve 243d and the common gas supply pipe 242 into the shower head 230.

The source gas is one of process gases, for example, disilicon hexachloride or hexachlorodisilane gas (i.e., $SiCl_6$ gas), which is a source containing silicon (Si). Also, the source gas may be any one of a solid, a liquid and a gas at normal temperature and pressure. When the source gas is a liquid at normal temperature and pressure, a vaporizer (not shown) may be installed between the source gas supply source 243b and the MFC 243c. Here, an example in which the source gas is a gas will be described.

The source gas supply system 243 is mainly configured by the first gas supply pipe 243a, the MFC 243c and the valve 243d. Also, the source gas supply system 243 may include the source gas supply source 243b and a first inert gas supply system which will be described below. Since the source gas supply system 243 supplies a source gas, which is one of process gases, the source gas supply system 243 corresponds to one of process gas supply systems.

A downstream end of a first inert gas supply pipe 246a is connected to the first gas supply pipe 243a at a downstream side of the valve 243d. An inert gas supply source 246b, an MFC 246c which is a flow rate control device (flow rate control unit), and a valve 246d which is an opening/closing valve are sequentially installed at the first inert gas supply pipe 246a in an upstream direction. An inert gas is supplied through the first inert gas supply pipe 246a via the MFC 246c, the valve 246d and the first gas supply pipe 243a into the shower head 230.

The inert gas acts as a carrier gas for a source gas, and a gas which does not react with a source is preferably used as the inert gas. Specifically, the inert gas may be, for example, nitrogen ($N_2$) gas. In addition to $N_2$ gas, a rare gas, such as helium (He) gas, neon (Ne), gas, argon (Ar) gas, etc., may be used.

A first inert gas supply system is mainly configured by the first inert gas supply pipe 246a, the MFC 246c and the valve 246d. Also, the first inert gas supply system may include the inert gas supply source 246b and the first gas supply pipe 243a. The first inert gas supply system may be included in the source gas supply system 243.

(Reactive Gas Supply System)

The RPU 244e is installed at a downstream side of the second gas supply pipe 244a. A reactive gas supply source 244b, an MFC 244c which is a flow rate control device (flow rate control unit), and a valve 244d which is an opening/closing valve are sequentially installed at an upstream side of the second gas supply pipe 244a in an upstream direction. A reactive gas is supplied through the second gas supply pipe 244a via the MFC 244c, the valve 244d, the RPU 244e and the common gas supply pipe 242 into the shower head 230. The reactive gas is put into a plasma state by the RPU 244e and radiated onto the wafer 200.

The reactive gas is one of process gases. For example, ammonia ($NH_3$) gas is used as the reactive gas.

The reactive gas supply system 244 is mainly configured by the second gas supply pipe 244a, the MFC 244c and the valve 244d. Also, the reactive gas supply system 244 may include the reactive gas supply source 244b, the RPU 244e and a second inert gas supply system which will be described below. Since the reactive gas supply system 244 supplies the reactive gas, which is one of the process gases, the reactive gas supply system 244 corresponds to another one of the process gas supply systems.

A downstream side of a second inert gas supply pipe 247a is connected to the second gas supply pipe 244a at a downstream side of the valve 244d. An inert gas supply source 247b, an MFC 247c which is a flow rate control device (flow rate control unit), and a valve 247d which is an opening/closing valve are sequentially installed at the second inert gas supply pipe 247a in an upstream direction. Also, an inert gas is supplied through the second inert gas supply pipe 247a via the MFC 247c, the valve 247d, the second gas supply pipe 244a and the RPU 244e into the shower head 230.

The inert gas acts as a carrier gas or a dilution gas for a reactive gas. Specifically, the inert gas may be, for example, nitrogen ($N_2$) gas. In addition to $N_2$ gas, a rare gas, such as He gas, Ne, gas, Ar gas, etc., may be used.

The second inert gas supply system is mainly configured by the second inert gas supply pipe 247a, the MFC 247c and the valve 247d. Also, the second inert gas supply system may include the inert gas supply source 247b, the second gas supply pipe 244a and the RPU 244e. The second inert gas supply system may be included in the reactive gas supply system 244.

(Purge Gas Supply System)

A purge gas supply source 245b, an MFC 245c which is a flow rate control device (flow rate control unit), and a valve 245d which is an opening/closing valve are sequentially installed at the third gas supply pipe 245a in an upstream direction. In a substrate processing process, an inert gas serving as a purge gas is supplied through the third gas supply pipe 245a via the MFC 245c, the valve 245d and the common gas supply pipe 242 into the shower head 230. Also, in a processing space cleaning process, an inert gas serving as a carrier gas or dilution gas for a cleaning gas is supplied via the MFC 245c, the valve 245d and the common gas supply pipe 242 into the shower head 230 when necessary.

An inert gas supplied from the purge gas supply source 245b acts as a purge gas for purging gases remaining in the process container 202 or the shower head 230 in the substrate processing process. Also, the inert gas may act as a carrier gas or dilution gas for a cleaning gas in the processing space cleaning process. Specifically, the inert gas may be, for example, nitrogen ($N_2$) gas. In addition to $N_2$ gas, a rare gas, such as He gas, Ne, gas, Ar gas, etc., may be used.

The purge gas supply system 245 is mainly configured by the third gas supply pipe 245a, the MFC 245c and the valve 245d. Also, the purge gas supply system 245 may include the purge gas supply source 245b and a processing space cleaning gas supply system which will be described below.

(Processing Space Cleaning Gas Supply System)

A downstream side of a processing space cleaning gas supply pipe 248a is connected to the third gas supply pipe 245a at a downstream side of the valve 245d. A processing space cleaning gas supply source 248b, an MFC 248c which is a flow rate control device (flow rate control unit), and a valve 248d which is an opening/closing valve are sequentially installed at the processing space cleaning gas supply pipe 248a in an upstream direction. In the processing space cleaning process, a cleaning gas is supplied through the third gas supply pipe 245a via the MFC 248c, the valve 248d and the common gas supply pipe 242 into the shower head 230.

The cleaning gas supplied from the processing space cleaning gas supply source 248b acts as a cleaning gas for removing byproducts adhered to the shower head 230 or the process container 202 in the processing space cleaning process. Specifically, for example, nitrogen trifluoride ($NF_3$) gas may be used as the cleaning gas. Also, for example, hydrogen fluoride (HF) gas, chlorine trifluoride ($ClF_3$) gas, fluorine ($F_2$) gas, and a combination thereof may be used as the cleaning gas.

The processing space cleaning gas supply system is mainly configured by the processing space cleaning gas supply pipe 248a, the MFC 248c and the valve 248d. Also, the processing space cleaning gas supply system may include the processing space cleaning gas supply source 248b and the third gas supply pipe 245a. The processing space cleaning gas supply system may be included in the purge gas supply system 245.

(Exhaust Buffer Chamber Cleaning Gas Supply System)

The substrate processing apparatus 100 includes an exhaust buffer chamber cleaning gas supply system 249 serving as a gas supply system in addition to the process gas cleaning gas supply system. The exhaust buffer chamber cleaning gas supply system 249 includes an exhaust buffer chamber cleaning gas supply pipe 249a (hereinafter, referred to simply as "cleaning gas supply pipe") configured to directly communicate with a top surface side of the exhaust buffer chamber 209. An exhaust buffer chamber cleaning gas supply source 249b, an MFC 249c which is a flow rate control device (flow rate control unit), and a valve 249d which is an opening/closing valve are sequentially installed at the cleaning gas supply pipe 249a in an upstream direction. Also, a cleaning gas is supplied through the cleaning gas supply pipe 249a via the MFC 249c and the valve 249d into the exhaust buffer chamber 209.

The cleaning gas supplied from the exhaust buffer chamber cleaning gas supply source 249b acts as a cleaning gas for removing byproducts adhered to an inner wall of the exhaust buffer chamber 209. Specifically, for example, nitrogen trifluoride ($NF_3$) gas may be used as the cleaning gas. Also, for example, hydrogen fluoride (HF) gas, chlorine trifluoride ($ClF_3$) gas, fluorine ($F_2$) gas, and a combination thereof may be used as the cleaning gas. Also, when the exhaust buffer chamber cleaning gas supply source 249b supplies the same type of cleaning gas as the processing space cleaning gas supply source 248b, the exhaust buffer chamber cleaning gas supply source 249b may not be necessarily installed separately from the processing space cleaning gas supply source 248b, but one of the exhaust buffer chamber cleaning gas supply source 249b and the processing space cleaning gas supply source 248b may be used in common.

The exhaust buffer chamber cleaning gas supply system 249 is mainly configured by the cleaning gas supply pipe 249a, the MFC 249c and the valve 249d. Also, the exhaust buffer chamber cleaning gas supply system 249 may include the exhaust buffer chamber cleaning gas supply source 249b.

(Gas Exhaust System)

An exhaust system for exhausting an atmosphere of the process container 202 includes a plurality of exhaust pipes connected to the process container 202. Specifically, the exhaust system includes a first exhaust pipe (not shown) connected to the transfer space 203 of the lower container 202b, a second exhaust pipe 222 connected to the exhaust buffer chamber 209 of the upper container 202a, and a third exhaust pipe 236 connected to the buffer space 232 of the shower head 230.

(First Gas Exhaust System)

The first exhaust pipe is connected to a side surface or bottom surface of the transfer space 203. A turbo molecular pump (TMP) (not shown) which is a vacuum pump for realizing a high vacuum or ultrahigh vacuum is installed at the first exhaust pipe. Also, a valve (not shown) is installed at the first exhaust pipe at a downstream side of the TMP, at an upstream side thereof, or at both sides thereof. A dry pump (DP) (not shown) may be installed together with the TMP at the first exhaust pipe. When the TMP operates, the DP functions as a subsidiary pump of the TMP. That is, the TMP and the DP exhaust an atmosphere of the transfer space 203 via the first exhaust pipe. At this time, since it is difficult for the TMP alone, which is a high vacuum (or ultrahigh vacuum) pump, to exhaust the atmosphere of the transfer space 203 to an atmospheric pressure, the DP is used as the subsidiary pump configured to exhaust the atmosphere of the transfer space 203 to the atmospheric pressure.

A first gas exhaust system is mainly configured by the first exhaust pipe, the TMP, the DP and the valve.

(Second Gas Exhaust System)

The second exhaust pipe 222 is connected to the inside of the exhaust buffer chamber 209 via an exhaust hole 221 installed in a top surface or side portion of the exhaust buffer chamber 209. An auto pressure controller (APC) 223 serving as a pressure control device for controlling the inside of the processing space 201, which communicates with the exhaust buffer chamber 209, to a predetermined pressure is installed at the second exhaust pipe 222. The APC 223 includes a valve body (not shown) of which an opening rate may be adjusted, and adjusts a conductance of the second exhaust pipe 222 in response to an instruction from a controller 260 which will be described below. A vacuum pump 224 is installed at the second exhaust pipe 222 at a downstream side of the APC 223. The vacuum pump 224 exhausts an atmosphere of the exhaust buffer chamber 209 and an atmosphere of the processing space 201 which communicates with the exhaust buffer chamber 209, via the second exhaust pipe 222. Also, valves (not shown) are installed at the second exhaust pipe 222 at a downstream side of the APC 223, an upstream side of the APC 223, or both sides thereof.

A second gas exhaust system is mainly configured by the second exhaust pipe 222, the APC 223, the vacuum pump 224 and a valve (not shown). Also, the vacuum pump 224 may use the DP in common with the first gas exhaust system.

(Third Gas Exhaust System)

The third exhaust pipe 236 is connected to a top surface or side surface of the buffer space 232. That is, the third exhaust pipe 236 is connected to the shower head 230 and thus, communicates with the buffer space 232 of the shower head 230. A valve 237 is installed at the third exhaust pipe 236. Also, a pressure adjustor 238 is installed at the third exhaust pipe 236 at a downstream side of the valve 237. A vacuum pump 239 is installed at the third exhaust pipe 236 at a downstream side of the pressure adjustor 238. The vacuum pump 239 exhausts an atmosphere of the buffer space 232 via the third exhaust pipe 236.

A third gas exhaust system is mainly configured by the third exhaust pipe 236, the valve 237, the pressure adjustor 238 and the vacuum pump 239. Also, the vacuum pump 239 may use the DP in common with the first gas exhaust system.

(Controller) The substrate processing apparatus 100 includes the controller 260 configured to control an operation of each of constitutional elements of the substrate processing apparatus 100. The controller 260 includes at least an operation unit 261 and a memory unit 262. The controller 260 is connected to each of the constitutional elements, calls a program or recipe from the memory unit 262 in response to an instruction from the controller 260 or a user, and controls the operation of each of the constitutional elements according to the contents of the program or the recipe. Specifically, the controller 260 is configured to control operations of the gate valve 205, the elevating mechanism 218, the heater 213, a radio-frequency (RF) power source 252, the matcher 251, the MFCs 243c to 248c, the valves 243d to 248d, the MFC 249c, the valve 249d, the APC 223, the TMP, the DP, the vacuum pumps 224 and 239, the valve 237, etc.

The controller 260 may be configured as a dedicated computer or configured as a general-purpose computer. For example, the controller 260 according to the present embodiment may be configured by preparing an external memory device storing a program as described above, e.g., a magnetic disk (a magnetic tape, a flexible disk, a hard disk, etc.), an optical disc (a compact disc (CD), a digital versatile disc (DVD), etc.), a magneto-optical (MO) disc, or a semiconductor memory (a Universal Serial Bus (USB) memory, a memory card, etc.), and then installing the program in a general-purpose computer using the external memory device.

In addition, means for supplying a program to a computer are not limited to using the external memory device. For example, a program may be supplied to a computer using communication means, e.g., the Internet or an exclusive line, without using the external memory device. The memory unit 262 or the external memory device may be configured as a non-transitory computer-readable recording medium. Hereinafter, the memory unit 262 and the external memory device may also be referred to together simply as a 'recording medium.' Also, when the term 'recording medium' is used in the present disclosure, it may be understood as only the memory unit 262, only the external memory device, or both the memory unit 262 and the external memory device.

(2) Details of Exhaust Buffer Chamber

Here, the exhaust buffer chamber 209 formed in the upper container 202a of the process container 202 will be described in detail with reference to FIGS. 2 through 4.

Figure 2:
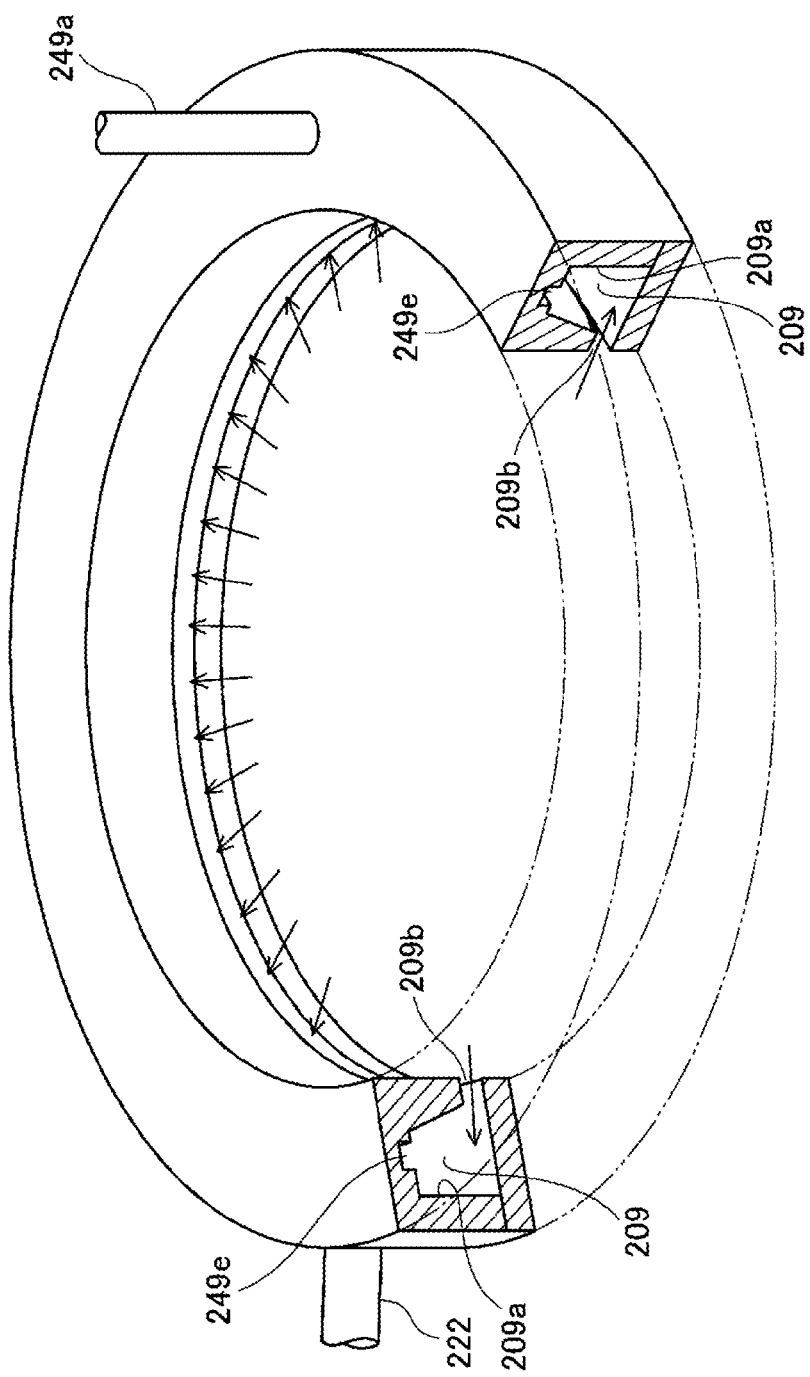
FIG. 2 is a schematic perspective view of an example of the overall shape of an exhaust buffer chamber of the substrate processing apparatus of FIG. 1.

FIG. 2 is a schematic perspective view of an example of the overall shape of an exhaust buffer chamber of the substrate processing apparatus of FIG. 1. FIG. 3 is a schematic side-sectional view of an example of a sectional shape of the exhaust buffer chamber of the substrate processing apparatus of FIG. 1. FIG. 4 is a schematic plan view of an example of a planar shape of the exhaust buffer chamber of the substrate processing apparatus of FIG. 1.

(Overall Shape)

The exhaust buffer chamber 209 functions as a buffer space when gases contained in the processing space 201 are discharged toward the circumference of a side portion of the processing space 201. Thus, the exhaust buffer chamber 209 includes a space surrounding an outer circumference of the side portion of the processing space 201 as shown in FIG. 2. That is, in a plan view, the exhaust buffer chamber 209 includes a space formed in a ring shape (annular shape) at an outer circumferential side of the processing space 201.

(Sectional Shape)

Figure 3:
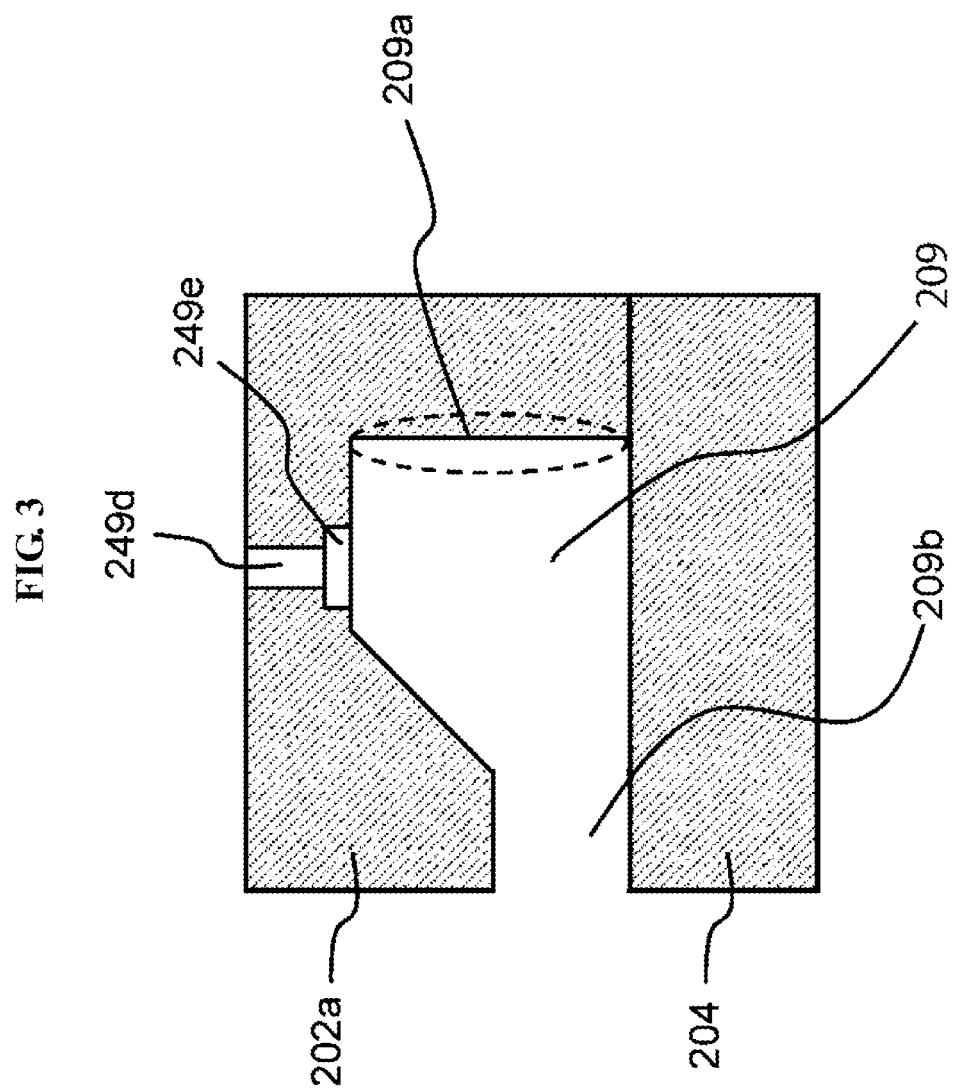
FIG. 3 is a schematic side-sectional view of an example of a sectional shape of the exhaust buffer chamber of the substrate processing apparatus of FIG. 1.
Figure 4:
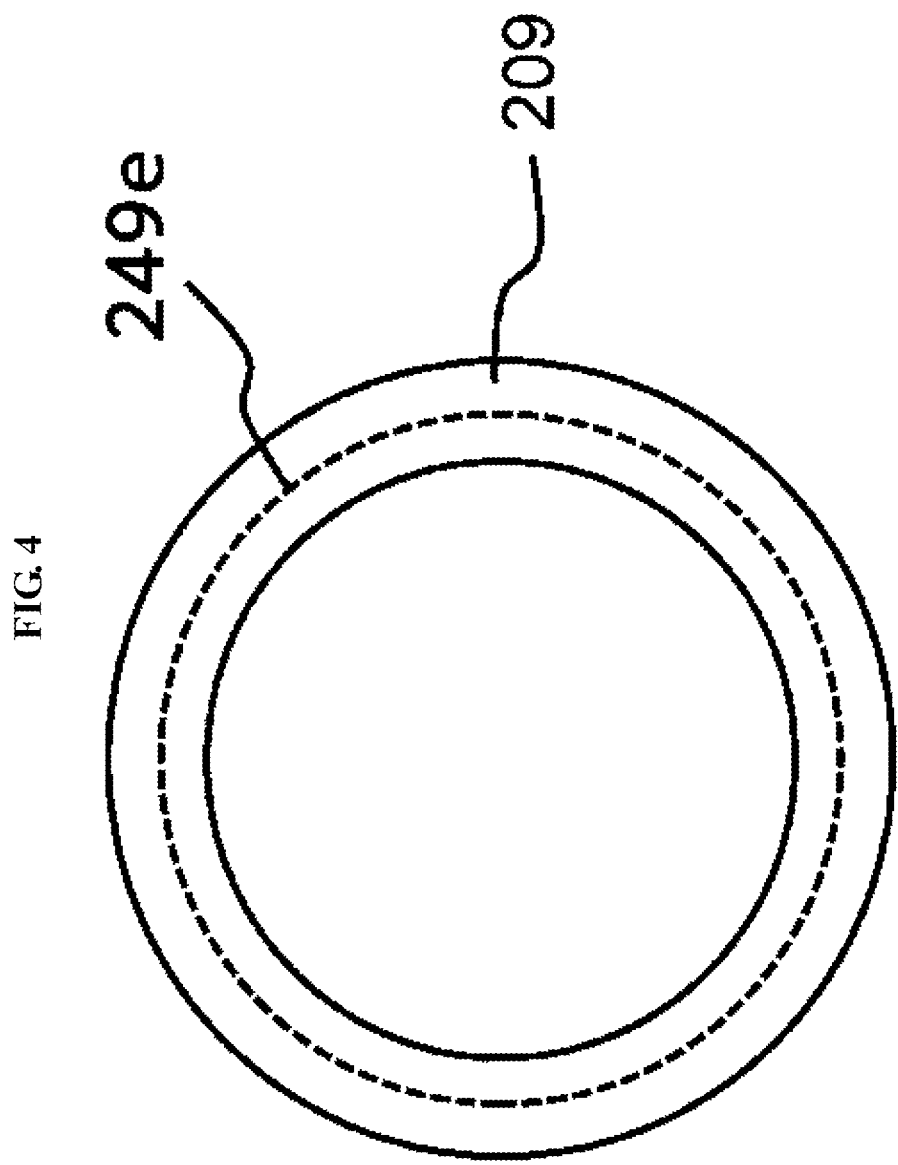
FIG. 4 is a schematic plan view of an example of a planar shape of the exhaust buffer chamber of the substrate processing apparatus of FIG. 1.

As shown in FIG. 3, a ceiling surface and both wall surfaces of the space of the exhaust buffer chamber 209 are formed by the upper container 202a, and a bottom surface of the space of the exhaust buffer chamber 209 is formed by the partition plate 204. Also, a communication hole 209b which communicates with the processing space 201 is installed at an inner circumferential side of the space of the exhaust buffer chamber 209, and gases supplied into the processing space 201 are supplied through the communication hole 209b into the space of the exhaust buffer chamber 209. The gases supplied into the space of the exhaust buffer chamber 209 are prevented from flowing due to a sidewall surface 209a of an outer circumferential side constituting the space of the exhaust buffer chamber 209, and collide with the sidewall surface 209a. That is, one sidewall constituting the space of the exhaust buffer chamber 209 (a sidewall of the outer circumferential side) functions as a gas flow blocking wall 209a, which extends in a direction in which the flow of gases passing through the communication hole 209b is blocked. The communication hole 209b which communicates with the processing space 201 is installed at another sidewall (a sidewall of the inner circumferential side) opposite to the gas flow blocking wall 209a. Thus, the exhaust buffer chamber 209 includes the communication hole 209b which communicates with the processing space 201 at least at the side portion of the processing space 201, and the gas flow blocking wall 209a extending in the direction in which the flow of gases passing through the communication hole 209b is blocked.

In addition, the space of the exhaust buffer chamber 209 extends to surround the outer circumference of the side portion of the processing space 201. Thus, the communication hole 209b installed in the sidewall of the inner circumferential side of the space of the exhaust buffer chamber 209 is installed to extend throughout the entire circumference of the outer circumference of the side portion of the processing space 201. In this case, in consideration of the fact that the exhaust buffer chamber 209 functions as a buffer space for exhausting gases, a size of the communication hole 209b obtained in a side-sectional height direction is preferably less than a size (height) of the space of the exhaust buffer chamber 209, which is obtained in the side-sectional height direction.

(Connection of Exhaust System)

As shown in FIG. 2, the second exhaust pipe 222 of the second gas exhaust system is connected to the space of the exhaust buffer chamber 209. Thus, gases supplied into the processing space 201 flow into the exhaust buffer chamber 209 through the communication hole 209b serving as a gas flow path between the processing space 201 and the exhaust buffer chamber 209 (refer to arrows of FIG. 2), and are exhausted through the second exhaust pipe 222. Due to the above-described structure, the gases of the processing space 201 may be rapidly exhausted. Also, the gases may be uniformly exhausted in an outer circumferential direction from the wafer 200. Accordingly, the gases may be uniformly supplied to the surface of the wafer 200. As a result, an in-plane surface of a substrate may be uniformly processed.

(Connection of Cleaning Gas Supply System)

As shown in FIG. 2, the cleaning gas supply pipe 249a of the exhaust buffer chamber cleaning gas supply system 249 is connected to a side of a top surface of the space of the exhaust buffer chamber 209. Thus, a cleaning gas supplied from the exhaust buffer chamber cleaning gas supply source 249b is supplied into the exhaust buffer chamber 209 through the cleaning gas supply pipe 249a.

From a cross-section obtained in a diametral direction of an annulus, as shown in FIG. 3, in the cleaning gas supply pipe 249a connected to the exhaust buffer chamber 209, a connection point which is connected to the space of the exhaust buffer chamber 209 is installed between the communication hole 209b serving as a gas flow path from the processing space 201 to the exhaust buffer chamber 209 and the gas flow blocking wall 209a serving as the sidewall of the outer circumferential side of the space of the exhaust buffer chamber 209. That is, the cleaning gas supply pipe 249a supplies the cleaning gas into the exhaust buffer chamber 209 at a downstream side of the communication hole 209b in a gas flow direction and at an upstream side of the gas flow blocking wall 209a in the gas flow direction.

In addition, to uniformize the supply of the cleaning gas into the exhaust buffer chamber 209, the cleaning gas supply pipe 249a is preferably connected to the exhaust buffer chamber 209 via gas supply grooves 249e.

As shown in FIG. 2 or FIG. 3, the gas supply grooves 249e are formed in the ceiling surface of the space of the exhaust buffer chamber 209. Also, as shown in FIG. 4, the gas supply grooves 249e are sequentially formed in a circumferential direction to surround the processing space 201. That is, the gas supply grooves 249e are formed to extend throughout the entire circumference of the exhaust buffer chamber 209. A sectional shape of the gas supply grooves 249e is not specifically limited as long as the gas supply grooves 249e are sequentially formed in the circumferential direction. Each of the gas supply grooves 249e may have an angular groove shape as shown in FIGS. 2 and 3 or other shapes [e.g., a circular groove shape].

Even if only one cleaning gas supply pipe 249a is connected to the exhaust buffer chamber 209 via the gas supply grooves 249e, after the cleaning gas diffuses into the entire circumference along the gas supply grooves 249e through the cleaning gas supply pipe 249a, the cleaning gas is supplied into the exhaust buffer chamber 209. Accordingly, the supply of the cleaning gas into the exhaust buffer chamber 209 may be uniformized, and the supply of the cleaning gas may be inhibited from concentrating on a specific point [e.g., near the connection point of the cleaning gas supply pipe 249a].

However, as long as the supply of the cleaning gas may be uniformized, the cleaning gas supply pipe 249a may not be necessarily connected to the exhaust buffer chamber 209 via the gas supply grooves 249e. For example, when a plurality of cleaning gas supply pipes 249a may be installed, each of the cleaning gas supply pipes 249a may be connected to the exhaust buffer chamber 209 at a plurality of the connection point. In this case, the supply of the cleaning gas into the exhaust buffer chamber 209 may be similarly uniformized.

(3) Substrate Processing Process

Next, a process of forming a thin film on the wafer 200 using the substrate processing apparatus 100 will be described as one process of a method of manufacturing a semiconductor device. In the following description, an operation of each of constitutional elements of the substrate processing apparatus 100 is controlled by the controller 260.

Here, an example in which a silicon nitride (SiN) film is formed as a silicon-containing film on the wafer 200 by means of an alternate supply method using $SiCl_6$ gas as a source gas (first process gas) and $NH_3$ gas as a reactive gas (second process gas) will be described.

Figure 5:
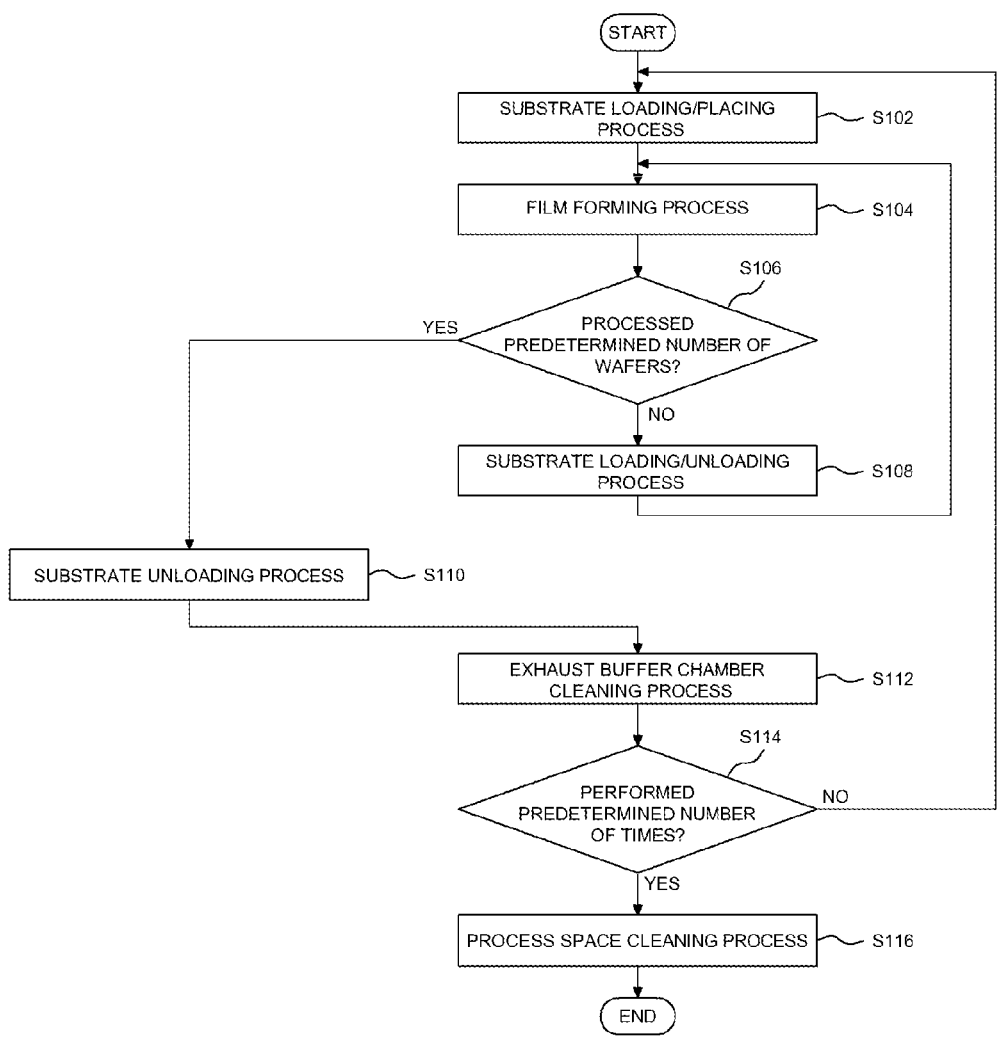
FIG. 5 is a flowchart illustrating a substrate processing process and a cleaning process according to an exemplary embodiment of the present invention.
Figure 6:
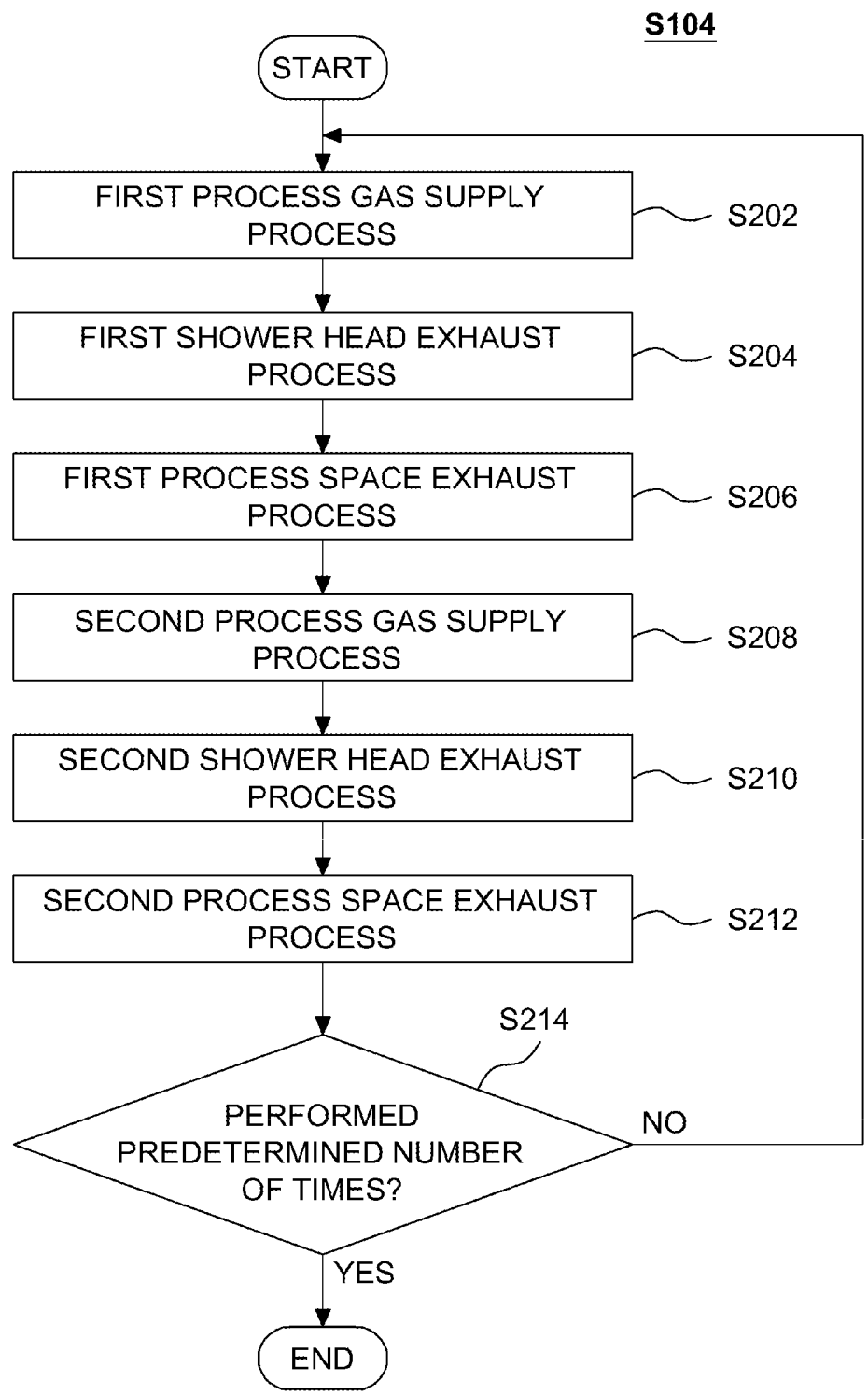
FIG. 6 is a detailed flowchart illustrating a film forming process of FIG. 5.

FIG. 5 is a flowchart illustrating a substrate processing process and a cleaning process according to the present embodiment. FIG. 6 is a detailed flowchart of a film forming process shown in FIG. 5.

(Substrate Loading/Placing Process S102)

In the substrate processing apparatus 100, the lift pins 207 penetrate the through holes 214 of the substrate placing table 212 by lowering the substrate placing table 212 to the transfer position of the wafer 200. As a result, the lift pins 207 protrude only a predetermined height from the surface of the substrate placing table 212. Subsequently, the gate valve 205 is opened so that the transfer space 203 may communicate with a carry chamber (not shown). The wafer 200 is loaded from the carry chamber into the transfer space 203 using a wafer carrier (not shown), and then carried onto the lift pins 207. Thus, the wafer 200 is supported in a horizontal posture on the lift pins 207 protruding from the surface of the substrate placing table 212.

When the wafer 200 is loaded into the process container 202, the wafer carrier escapes from the process container 202, and the gate valve 205 is closed to air-tightly close the inside of the process container 202. Thereafter, the wafer 200 is placed on the substrate placing surface 211 installed on the substrate placing table 212 by elevating the substrate placing table 212. Also, the wafer 200 is elevated to the above-described process position of the processing space 201 by elevating the substrate placing table 212.

When the wafer 200 is loaded into the process container 202, the valve of the first gas exhaust system is put into an open state (is opened), so that the transfer space 203 may communicate with the TMP and the TMP may communicate with the DP. Meanwhile, the valves of the exhaust system other than the valve of the first gas exhaust system are put into a closed state (are closed). Thus, an atmosphere of the transfer space 203 is exhausted due to the TMP and the DP, and the process container 202 reaches a high vacuum (ultrahigh vacuum) state (e.g., a pressure of $10^{-5}$ Pa or less). During the current process, the process container 202 is put into a high vacuum (ultrahigh vacuum) state to reduce a difference in pressure between the process container 202 and the carry chamber which is similarly maintained in a high vacuum (ultrahigh vacuum) state (e.g., a pressure of $10^{-6}$ Pa or less). In this state, the gate valve 205 is opened, and the wafer 200 is loaded from the carry chamber into the transfer space 203. Also, the TMP and the DP are continuously operated during the processes shown in FIGS. 5 and 6 not to cause a delay in a processing process due to rises in operations of the TMP and the DP.

After the wafer 200 is loaded into the transfer space 203, when the wafer 200 is elevated to the process position in the processing space 201, the valve of the first gas exhaust system is put into a closed state. Thus, the transfer space 203 is cut off from the TMP, so the exhaust of the transfer space 203 due to the TMP is ended. Meanwhile, the exhaust buffer chamber 209 communicates with the APC 223 by opening the valve of the second gas exhaust system, and also the APC 223 communicates with the vacuum pump 224. The APC 223 may adjust a conductance of the second exhaust pipe 222 and control the flow rate of gases exhausted from the exhaust buffer chamber 209 due to the vacuum pump 224, so that the processing space 201 which communicates with the exhaust buffer chamber 209 may be maintained under a predetermined pressure. Also, the valves of other exhaust systems are maintained in a closed state. Also, when the valves of the first gas exhaust system are closed off, an operation of the TMP is stably maintained by putting a valve disposed at the downstream side of the TMP into a closed state after putting a valve disposed at the upstream side of the TMP into a closed state.

During the above-described process, $N_2$ gas serving as an inert gas may be supplied into the process container 202 through the inert gas supply system while exhausting the inside of the process container 202. That is, while exhausting the inside of the process container 202 via the exhaust buffer chamber 209 using the TMP or DP, $N_2$ gas may be supplied into the process container 202 by opening at least the valve 245d of the third gas supply system. Thus, particles may be inhibited from being adhered onto the wafer 200.

In addition, when the wafer 200 is placed on the substrate placing table 212, power is supplied to the heater 213 embedded in the substrate placing table 212, and the surface of the wafer 200 is controlled to a predetermined processing temperature. In this case, a temperature of the heater 213 is adjusted by controlling an amount of current supplied into the heater 213 based on temperature information detected by a temperature sensor (not shown).

Thus, in the substrate loading/placing process S102, the inside of the processing space 201 is controlled to a predetermined processing pressure and also, a temperature of the surface of the wafer 200 is controlled to a predetermined processing temperature. Here, the predetermined processing temperature and the predetermined processing pressure are a processing temperature and a processing pressure at which an SiN film may be formed using an alternate supply method during a film forming process S104 which will be described below. That is, the predetermined processing temperature and the predetermined processing pressure are a processing temperature and a processing pressure at which a source gas supplied during a first process gas (source gas) supply process S202 does not self-decompose. Specifically, the processing temperature is in the range of room temperature to a temperature of about 500° C. and preferably, in the range of room temperature to a temperature of about 400° C., and the processing pressure is in the range of 50 Pa to 5000 Pa. The processing temperature and the processing pressure are maintained during the film forming process S104 which will be described below.

(Film Forming Process S104)

After the substrate loading/placing process S102, the film forming process S104 is performed. Hereinafter, the film forming process S104 will be described in detail with reference to FIG. 6. Also, the film forming process S104 is a cyclic processing process of repeating a process of alternately supplying different process gases.

(First Process Gas Supply Process S202)

In the film forming process S104, a first process gas (source gas) supply process S202 is preferentially performed. When a first process gas is, for example, a liquid source such as $TiCl_4$, the source is vaporized to generate a source gas (i.e., $TiCl_4$ gas) (preliminary vaporization) in advance. The preliminary vaporization of the source gas may be performed simultaneously with the above-described substrate loading/placing process S102. This is because a predetermined time is required to stably generate the source gas.

When the first process gas is supplied, the supply of the source gas ($SiCl_6$ gas) into the processing space 201 is started by opening the valve 243d and adjusting the MFC 243c such that the source gas has a predetermined flow rate. A supply flow rate of the source gas is in the range of, for example, 100 sccm to 500 sccm. The source gas is dispersed by the shower head 230 and uniformly supplied onto the wafer 200 in the processing space 201.

In this case, the valve 246d of the first inert gas supply system is opened, and an inert gas ($N_2$ gas) is supplied through the first inert gas supply pipe 246a. A supply flow rate of the inert gas is in the range of, for example, 500 sccm to 5000 sccm. Also, the inert gas may be supplied through the third gas supply pipe 245a of the purge gas supply system.

The remnant source gas is uniformly supplied from the processing space 201 into the exhaust buffer chamber 209, flows through the second exhaust pipe 222 of the second gas exhaust system, and is exhausted. Specifically, the valve of the second gas exhaust system is put into an open state, and a pressure of the processing space 201 is controlled by the APC 223 to be a predetermined pressure. Also, all the valves of the exhaust systems other than the valve of the second gas exhaust system are in a closed state.

At this time, a processing temperature and a processing pressure in the processing space 201 are a processing temperature and a processing pressure at which the source gas does not self-decompose. Accordingly, gas molecules of the source gas are adsorbed onto the wafer 200.

After a predetermined time has elapsed since the supply of the source gas started, the valve 243d is closed off, and the supply of the source gas is stopped. A supply time of the source gas and the carrier gas is in the range of, for example, 2 seconds to 20 seconds.

(First Shower Head Exhaust Process S204)

After the supply of the source gas is stopped, an inert gas ($N_2$ gas) is supplied through the third gas supply pipe 245a, and the shower head 230 is purged. From among the valves of the gas exhaust system, the valve of the second gas exhaust system is put into a closed state, while the valve 237 of the third gas exhaust system is put into an open state. The valves of other gas exhaust system are in a closed state. That is, when the shower head 230 is purged, the exhaust buffer chamber 209 is cut off from the APC 223 to stop the control of pressure due to the APC 223, while the buffer space 232 communicates with the vacuum pump 239. Thus, the source gas remaining in the shower head 230 [buffer space 232] is exhausted by the vacuum pump 239 via the third exhaust pipe 236 through the shower head 230. At this time, the valve installed at a downstream side of the APC 223 may be opened.

A flow rate of the inert gas ($N_2$ gas) supplied during the first shower head exhaust process S204 is in the range of, for example, 1000 sccm to 10000 sccm. Also, a supply time of the inert gas is in the range of, for example, 2 seconds to 10 seconds.

(First Processing Space Exhaust Process S206)

When the purge of the shower head 230 ends, the processing space 201 is subsequently purged by supplying the inert gas ($N_2$ gas) through the third gas supply pipe 245a. At this time, the valve of the second gas exhaust system is put into an open state, and a pressure of the processing space 201 is controlled by the APC 223 to be a predetermined pressure. Meanwhile, all the valves of the exhaust systems other than the valve of the second gas exhaust system are put into a closed state. Thus, the source gas which has not been adsorbed to the wafer 200 during the first process gas supply process S202 is removed by the vacuum pump 224 of the second gas exhaust system from the processing space 201 via the second exhaust pipe 222 and the exhaust buffer chamber 209.

A supply flow rate of the inert gas ($N_2$ gas) during the first processing space exhaust process S206 is in the range of, for example, 1000 sccm to 10000 sccm. Also, a supply time of the inert gas is in the range of, for example, 2 seconds to 10 seconds.

Although the present embodiment has described an example in which the first processing space exhaust process S206 is performed after the first shower head exhaust process S204, the first shower head exhaust process S204 may be performed after the first processing space exhaust process S206. Also, the first shower head exhaust process S204 may be performed simultaneously with the first processing space exhaust process S206.

(Second Process Gas Supply Process S208)

When the purge of the shower head 230 and the processing space 201 is completed, a second process gas (reactive gas) supply process S208 is performed. During the second process gas supply process S208, the valve 244d is opened, and the supply of a reactive gas ($NH_3$ gas) via the RPU 244e and the shower head 230 into the processing space 201 starts. In this case, the MFC 244c is adjusted such that the reactive gas has a predetermined flow rate. A supply flow rate of the reactive gas is in the range of, for example, 1000 sccm to 10000 sccm.

A reactive gas in a plasma state is dispersed by the shower head 230 and uniformly supplied onto the wafer 200 in the processing space 201, and reacts with a source-gas-containing film adsorbed onto the wafer 200 to generate an SiN film on the wafer 200.

In this case, the valve 247d of the second inert gas supply system is opened, and the inert gas ($N_2$ gas) is supplied through the second inert gas supply pipe 247a. A supply flow rate of the inert gas is in the range of, for example, 500 sccm to 5000 sccm. Also, the inert gas may be supplied through the third gas supply pipe 245a of the purge gas supply system.

The remnant reactive gas or reaction byproducts are supplied from the processing space 201 into the exhaust buffer chamber 209, flow through the second exhaust pipe 222 of the second gas exhaust system, and are exhausted. Specifically, the valve of the second gas exhaust system is put into an open state, and a pressure of the processing space 201 is controlled by the APC 223 to be a predetermined pressure. Also, all the valves of the exhaust systems other than the valve of the second gas exhaust system are in a closed state.

After a predetermined time has elapsed since the supply of the reactive gas started, the valve 244d is closed off, and the supply of the reactive gas is stopped. A supply time of the reactive gas and the carrier gas is in the range of, for example, 2 seconds to 20 seconds.

(Second Shower Head Exhaust Process S210)

After the supply of the reactive gas is stopped, a second shower head exhaust process S210 is performed to remove the reactive gas or reaction byproducts remaining in the shower head 230. Sine the second shower head exhaust process S210 may be performed in the same manner as the previously described first shower head exhaust process S204, descriptions thereof are omitted here.

(Second Processing Space Exhaust Process S212)

After the purge of the shower head 230 ends, a second processing space exhaust process S212 is performed to remove the reactive gas or reaction byproducts remaining in the processing space 201. Since the second processing space exhaust process S212 may be performed in the same manner as the previously described first processing space exhaust process S206, descriptions thereof are omitted here.

(Determining Process S214)

The above-described first process gas supply process S202, first shower head exhaust process S204, first processing space exhaust process S206, second process gas supply process S208, second shower head exhaust process S210, and second processing space exhaust process S212 are included in one cycle. The controller 260 determines whether the cycle has been performed a predetermined number of times (n cycles) (S214). When the cycle has been performed the predetermined number of times, a silicon nitride (SiN) film is formed on the wafer 200 to a predetermined film thickness.

(Processed Wafer Number Determining Process S106)

After the film forming process S104 including the above-described processes S202 to S214 is performed, as shown in FIG. 5, it is determined whether the number of wafers 200 processed during the film forming process S104 has reached a predetermined number (S106).

When the number of the wafers 200 processed in the film forming process S104 has not reached the predetermined number, the processed wafers 200 are withdrawn, and the substrate processing process enters a substrate loading/unloading process S108 to start processing the next wafer 200 which is on standby. Also, when the film forming process S104 has been performed on a predetermined number of wafers 200, the processed wafers 200 are withdrawn, and the substrate processing process enters a substrate unloading process S110 to enter into a state where the wafer 200 is absent in the process container 202.

(Substrate Loading/Unloading Process S108)

In the substrate loading/unloading process S108, by lowering the substrate placing table 212, the wafer 200 is supported on the lift pins 207 protruding from the surface of the substrate placing table 212. Thus, the wafer 200 is moved from the process position to the transfer position. Afterwards, the gate valve 205 is opened, and the wafer 200 is unloaded out of the process container 202 using a wafer carrier. In this case, the valve 245d is closed off, and the supply of the inert gas through the third gas supply system into the process container 202 is stopped.

While the wafer 200 is being moved from the process position to the transfer position during the substrate loading/unloading process S108, the valve of the second gas exhaust system is put into a closed state, and the control of a pressure due to the APC 223 is stopped. Meanwhile, by putting the valve of the first gas exhaust system into an open state and exhausting the atmosphere of the transfer space 203 using the TMP and the DP, the process container 202 is maintained in a high vacuum (ultrahigh vacuum) state (e.g., a pressure of $10_{-5}$ Pa or less), and a difference in pressure between the process container 202 and the carry chamber similarly maintained in a high vacuum (ultrahigh vacuum) state (e.g., a pressure of $10^{-6}$ Pa or less) is reduced. In this state, the gate valve 205 is opened, and the wafer 200 is unloaded from the process container 202 into the carry chamber.

Afterwards, in the substrate loading/unloading process S108, the next new wafer 200 which is on standby is loaded into the process container 202 in the same order as in the above-described substrate loading/placing process S102. The wafer 200 is elevated to the process position in the processing space 201 and also, the inside of the processing space 201 is set to a predetermined process temperature and a predetermined process pressure to enter into a state where the next film forming process S104 may start. Also, the film forming process S104 and the processed wafer number determining process S106 are performed on the new wafer 200 in the processing space 201.

(Substrate Unloading Process S110)

In the substrate unloading process S110, the wafer 200 which has been processed in the same order as in the above-described substrate loading/unloading process S108 is withdrawn from the process container 202 and loaded into the carry chamber. However, unlike in the substrate loading/unloading process S108, in the substrate unloading process S110, the loading of the next new wafer 200 which is on standby into the process container 202 is not performed, and the wafer 200 is absent in the process container 202.

When the substrate unloading process S110 ends, the substrate processing process enters a cleaning process.

(4) Cleaning Process

Next, a process of cleaning the inside of the process container 202 of the substrate processing apparatus 100 as one process of the method of manufacturing the semiconductor device will be described with reference to FIG. 5.

(Exhaust Buffer Chamber Cleaning Process S112)

In the substrate processing apparatus 100, the film forming process S104 is performed on a predetermined number of wafers 200 each time the substrate unloading process S110 ends, and thereafter an exhaust buffer chamber cleaning process S112 is performed each time the substrate processing process is put into a state where the wafer 200 is absent in the process container 202.

When the film forming process S104 is performed on the wafer 200, an exhaust gas flows from the processing space 201 through the communication hole 209b into the exhaust buffer chamber 209, collides with the gas flow blocking wall 209a, and is prevented from flowing. Thereafter, the exhaust gas temporarily stays in the exhaust buffer chamber 209 until the exhaust gas is exhausted through the second exhaust pipe 222 of the second gas exhaust system. Thus, when the film forming process S104 is repetitively performed on a predetermined number of wafers 200, reaction byproducts or reactants generated by a reaction between the remnant gases are easily deposited on or near the gas flow blocking wall 209a of the exhaust buffer chamber 209. For this reason, in the substrate processing apparatus 100, the exhaust buffer chamber 209 is cleaned by performing the exhaust buffer chamber cleaning process S112 each time the film forming process S104 is performed on a predetermined number of wafers 200.

In the exhaust buffer chamber cleaning process S112, the valve 249d of the exhaust buffer chamber cleaning gas supply system 249 is opened, and a cleaning gas is supplied from the exhaust buffer chamber cleaning gas supply source 249b through the cleaning gas supply pipe 249a into the exhaust buffer chamber 209. The supplied cleaning gas removes deposits (reaction byproducts, etc.) adhered to the inner wall of the exhaust buffer chamber 209. Hereinafter, a cleaning process performed by supplying the cleaning process from the cleaning gas supply pipe 249a into the exhaust buffer chamber 209 will be referred to as a "first cleaning process".

In this case, the cleaning gas supply pipe 249a is connected to the inside of the exhaust buffer chamber 209 between the communication hole 209b and the gas flow blocking wall 209a. Thus, the cleaning gas is supplied into the exhaust buffer chamber 209 at an upstream side of the gas flow blocking wall 209a in a direction in which gases flow. Accordingly, since the cleaning gas may be supplied near the gas flow blocking wall 209a and arrive at the gas flow blocking wall 209a before the cleaning gas is deactivated, it becomes possible to effectively remove deposits from the gas flow blocking wall 209a.

When the cleaning gas supply pipe 249a is connected to the exhaust buffer chamber 209 via the gas supply grooves 249e, the cleaning gas is dispersed in the entire circumference along the gas supply grooves 249e and then supplied into the exhaust buffer chamber 209. Thus, the cleaning gas may be uniformly supplied into the exhaust buffer chamber 209, so that deposits adhered to the inner wall of the exhaust buffer chamber 209 may be uniformly removed throughout the entire circumference. That is, over-etching may be inhibited near a connection point between the exhaust buffer chamber 209 and the cleaning gas supply pipe 249a, and generation of a cleaning residue may be prevented at points isolated from the connection point between the exhaust buffer chamber 209 and the cleaning gas supply pipe 249a.

In the exhaust buffer chamber cleaning process S112, to adjust to the supply of the cleaning gas through the cleaning gas supply pipe 249a, the valves 243d, 244d, 246d, 247d and 248d are put into a closed state, and the valve 245d is put into an open state. Thus, to adjust to the supply of the cleaning gas through the cleaning gas supply pipe 249a into the exhaust buffer chamber 209, an inert gas is supplied through the purge gas supply source 245b of the purge gas supply system 245 via the third gas supply pipe 245a and the common gas supply pipe 242 into the processing space 201. Also, an expression "to adjust to the supply of the cleaning gas" may also be interpreted as "to prevent the cleaning gas supplied into the exhaust buffer chamber 209 from intruding into the processing space 201". Accordingly, specifically, after the inert gas is supplied in advance, the cleaning gas is supplied. Alternatively, the inert gas is supplied at latest simultaneously with the cleaning gas.

In this case, the MFC 245c of the purge gas supply system 245 adjusts the amount of the inert gas supplied into the processing space 201 so that the cleaning gas supplied into the exhaust buffer chamber 209 may not flow into the processing space 201 through the communication hole 209b. Specifically, the supplied amount of the inert gas is set to be larger than the supplied amount of the cleaning gas.

Thus, the cleaning gas supplied into the exhaust buffer chamber 209 is used only to perform the first cleaning process on the inside of the exhaust buffer chamber 209, and becomes effective in reliably removing deposits from the inner wall of the exhaust buffer chamber 209. Also, the cleaning gas supplied into the exhaust buffer chamber 209 during the exhaust buffer chamber cleaning process S112 may be prevented from intruding into the processing space 201. Thus, when a processing space cleaning process S116 which will be described below is performed, over-etching may be prevented at a point of the processing space 201 near the exhaust buffer chamber 209.

The exhaust buffer chamber cleaning process S112 ends after the above-described first cleaning process is performed for a predetermined time. The predetermined time is not specifically limited as long as the predetermined time is appropriately set in advance. Specifically, the exhaust buffer chamber cleaning process S112 ends by closing off the valve 249d of the exhaust buffer chamber cleaning gas supply system 249 and the valve 245d of the purge gas supply system 245.

(Process Number Determining Process S114)

After the above-described exhaust buffer chamber cleaning process S112, it is determined whether the number of times the exhaust buffer chamber cleaning process S112 was performed has reached a predetermined number (S114).

As a result, when it is determined that the number of times the exhaust buffer chamber cleaning process S112 was performed has not reached the predetermined number, after a count number of the number of times the exhaust buffer chamber cleaning process S112 is performed is increased by one, the substrate processing process enters into a state where a series of processes S102 to S112 starting from the substrate loading/placing process S102 may be performed on the next new wafer 200 which is on standby. Meanwhile, when the number of times the exhaust buffer chamber cleaning process S112 was performed has reached the predetermined number, the substrate processing process enters the processing space cleaning process S116.

(Processing Space Cleaning Process S116)

In the processing space cleaning process S116, while the valves 243d, 244d, 245d, 246d, 247d and 249d are being in a closed state, the valve 248d is put into an open state. Thus, a cleaning gas is supplied from the processing space cleaning gas supply source 248b of the processing space cleaning gas supply system through the third gas supply pipe 245a and the common gas supply pipe 242 into the processing space 201. The supplied cleaning gas removes adhered materials (reaction byproducts, etc.) from the processing space 201. Hereinafter, a cleaning process performed by supplying the cleaning gas through the processing space cleaning gas supply system into the processing space 201 will be referred to as a "second cleaning process".

In addition, the adhered materials in the processing space 201 are less liable to be delaminated than adhered materials in the exhaust buffer chamber 209. The adhered materials adhered to the inner wall of the exhaust buffer chamber 209 are unstable in terms of a film thickness or film density because the adhered materials are adhered under different temperature and pressure conditions from film forming conditions. However, the adhered materials adhered to the processing space 201 are stable in terms of a film thickness or film density because the adhered materials are adhered under the same temperature and pressure conditions as the film forming conditions. Accordingly, a cleaning gas used in the second cleaning process performed during the processing space cleaning process S116 needs a higher cleaning power than a cleaning gas used in the first cleaning process performed during the exhaust buffer chamber cleaning process S112.

Accordingly, a cleaning gas supplied in the second cleaning process performed during the processing space cleaning process S116 is more active than the first cleaning process performed during the exhaust buffer chamber cleaning process S112. Here, the activity refers to energy of the cleaning gas. A cleaning gas having a higher activity and higher energy has higher cleaning power and is more capable of cleaning and removing a denser film.

When the processing space cleaning gas supply source 248b and the exhaust buffer chamber cleaning gas supply source 249b are installed separately, the supply of a cleaning gas having high energy may be embodied by supplying different types of cleaning gases through the processing space cleaning gas supply source 248b and the exhaust buffer chamber cleaning gas supply source 249b, respectively. That is, a cleaning gas having a high activity and high energy is supplied from the processing space cleaning gas supply source 248b, while a cleaning gas having a low activity and low energy is supplied from the exhaust buffer chamber cleaning gas supply source 249b.

However, even if the processing space cleaning gas supply source 248b and the exhaust buffer chamber cleaning gas supply source 249b supply the same type of cleaning gas, the supply of a cleaning gas having high energy may be embodied as described below.

Specifically, for example, the heater 213 is turned on in the second cleaning process performed during the processing space cleaning process S116. Thus, it becomes possible to increase energy of a cleaning gas supplied in the second cleaning process higher than energy of a cleaning gas supplied in the first cleaning process performed during the exhaust buffer chamber cleaning process S112. By supplying a cleaning gas having high energy, the second cleaning process may clean and remove a denser film than the first cleaning process.

For example, supplementing the energy of the cleaning gas supplied in the second cleaning process is not limited to turning on the heater 213 and may include putting the cleaning gas supplied in the second cleaning process into a plasma state to have higher energy than the cleaning gas supplied in the first cleaning process. That is, when the cleaning gas satisfies the shower head 230 and the processing space 201 in the second cleaning process, power may be applied to the RF power source 252 and also, plasma of the cleaning gas may be generated in the shower head 230 and the processing space 201 by adjusting an impedance using the matcher 251. Also, in a case where the cleaning gas supplied in the first cleaning process is put into a plasma state, the matcher 251 and the RF power source 252 are controlled to generate plasma having higher energy in the second cleaning process.

(Frequencies of First Cleaning Process and Second Cleaning Process)

As described above, in the substrate processing apparatus 100, after the first cleaning process is performed only a predetermined number of times during the exhaust buffer chamber cleaning process S112, the second cleaning process is performed during the processing space cleaning process S116. That is, the controller 260 configured to control each of the processes S112 and S116 increases frequencies at which the first cleaning process of supplying the cleaning gas through the cleaning gas supply pipe 249a into the exhaust buffer chamber 209 and the second cleaning process of supplying the cleaning gas through the processing space cleaning gas supply system into the processing space 201 are performed so that the first cleaning process may be more frequently performed than that of the second cleaning process as described below.

Since adhered materials adhered to the inner wall of the exhaust buffer chamber 209 are adhered under different temperature and pressure conditions from film forming conditions, the adhered materials are unstable in terms of a film thickness or film density, and easily delaminated when thermal stress or physical stress is applied. Meanwhile, since adhered materials in the processing space 201 are adhered under the same temperature and pressure conditions as the film forming conditions, the adhered materials are stable in terms of a film thickness or film density. That is, the adhered materials adhered to the inner wall of the exhaust buffer chamber 209 are weaker and more liable to be delaminated than the adhered materials in the processing space 201. Thus, it is inferred that the adhered materials adhered to the inner wall of the exhaust buffer chamber 209 may be delaminated due to a pressure variation for a switch of the supply of gases. Accordingly, the controller 260 is configured to performs the first cleaning process more frequently than the second cleaning process.

(5) Effects of the Present Embodiment

According to the present embodiment, one or more effects which will be described below may be obtained.

(a) According to the present embodiment, a cleaning gas is directly supplied into the exhaust buffer chamber 209 having a space surrounding an outer circumference of a side portion of the processing space 201 using the cleaning gas supply pipe 249a which communicates with the space of the exhaust buffer chamber 209. Accordingly, even if unnecessary films or byproducts are adhered as deposits to an inner wall of the exhaust buffer chamber 209, the cleaning gas may reach the inside of the exhaust buffer chamber 209 before the cleaning gas is deactivated. Thus, the deposits may be reliably removed. As a result, a cleaning process may be sufficiently performed on the inside of the exhaust buffer chamber 209. Also, since the cleaning of the inside of the exhaust buffer chamber 209 is performed during the exhaust buffer chamber cleaning process S112, operational efficiency of an apparatus may be prevented from being lowered unlike when an operator performs a cleaning process by handwork during maintenance of the apparatus. Therefore, it may be concluded that the cleaning process may be satisfactorily performed.

In addition, according to the present embodiment, since the cleaning gas supply pipe 249a supplies a cleaning gas into the exhaust buffer chamber 209 through a connection point [i.e., a somewhat upstream side of the gas flow blocking wall 209a in a direction of gas flow] installed between the communication hole 209b and the gas flow blocking wall 209a, it becomes possible to satisfactorily perform a cleaning process of removing deposits from the exhaust buffer chamber 209, particularly, the gas flow blocking wall 209a to which the deposits may be easily adhered.

That is, according to the present embodiment, even when gases are exhausted from the processing space 201 using the exhaust buffer chamber 209, a cleaning process may be sufficiently and satisfactorily performed on the inside of the exhaust buffer chamber 209.

(b) According to the present embodiment, the cleaning gas supply pipe 249a is connected to the exhaust buffer chamber 209 at a plurality of connection points via the gas supply grooves 249e sequentially formed in a circumferential direction to surround the processing space 201. Thus, the supply of a cleaning gas into the exhaust buffer chamber 209 may be uniformized, and the supply of the cleaning gas may be prevented from concentrating on a specific point [e.g., near the connection point of the cleaning gas supply pipe 249a]. Accordingly, deposits in the exhaust buffer chamber 209 may be uniformly removed throughout the entire circumference of the exhaust buffer chamber 209.

(c) According to the present embodiment, an inert gas is supplied from the purge gas supply source 245b of the purge gas supply system 245 through the third gas supply pipe 245a and the common gas supply pipe 242 into the processing space 201 to adjust to the supply of the cleaning gas through the cleaning gas supply pipe 249a into the exhaust buffer chamber 209. Thus, the cleaning gas supplied into the exhaust buffer chamber 209 may be prevented from intruding into the processing space 201 during the exhaust buffer chamber cleaning process S112. Accordingly, even if the cleaning gas is supplied into the exhaust buffer chamber 209, when the processing space cleaning process S116 is performed, over-etching may be inhibited at a point of the processing space 201 near the exhaust buffer chamber 209.

(d) According to the present embodiment, the first cleaning process performed in the exhaust buffer chamber cleaning process S112 and the second cleaning process performed in the processing space cleaning process S116 are increased in a manner that the first cleaning process may be is more frequently performed than the second cleaning process. Accordingly, even if adhered materials adhered to the inner wall of the exhaust buffer chamber 209 are weaker and more liable to be delaminated than adhered materials in the processing space 201, the adhered materials adhered to the inside of the exhaust buffer chamber 209 may be appropriately removed by performing the cleaning of the exhaust buffer chamber 209 more frequently. That is, even if the materials adhered to the inner wall of the exhaust buffer chamber 209 are likely to be easily delaminated by to a pressure variation during a switch of the supply of gases, the adhered materials may be prevented from intruding into the processing space 201, adversely affecting characteristics of a film formed on the wafer 200, and causing a reduction in yield.

(e) According to the present embodiment, a cleaning gas supplied in the first cleaning process is less active than a cleaning gas supplied in the second cleaning process. That is, since materials adhered to the inner wall of the exhaust buffer chamber 209 are weaker and more liable to be delaminated than adhered materials in the processing space 201, energy of the cleaning gas supplied into the exhaust buffer chamber 209 using the first cleaning process is set to be lower than energy of the cleaning gas supplied into the processing space 201 using the second cleaning process. Thus, even if the cleaning gas is directly supplied into the exhaust buffer chamber 209, over-etching may be prevented in the exhaust buffer chamber 209.

(f) According to the present embodiment, energy of the cleaning gas supplied in the second cleaning process may be supplemented by turning on the heater 213 in the second cleaning process performed during the processing space cleaning process S116. Even if a dense film is adhered to the inside of the processing space 201, the dense film may be reliably removed.

Other Embodiments of the Present Invention

While the embodiments of the present invention have been described above in detail, the present invention is not limited thereto, and various changes may be made therein without departing from the spirit of the invention.

For example, although the previous embodiment has described a film forming process as an example of a process performed by the substrate processing apparatus 100, the present invention is not limited thereto. That is, in addition to the film forming process, the present invention may be applied to a process of forming an oxide film or a nitride film and a process of forming a metal-containing film. Also, irrespective of specific contents of a substrate processing process, the present invention may be applied to not only the film forming process but also other substrate processing processes, such as an annealing process, an oxidation process, a nitridation process, a lithography process, etc. Also, the present invention may be applied to other substrate processing apparatuses, such as an annealing processing apparatus, an oxidation apparatus, a nitridation apparatus, an exposure apparatus, a coating apparatus, a drying apparatus, a heating apparatus, a processing apparatus using plasma, etc. Also, the present invention may be applied to a mixture of the above-described apparatuses. Furthermore, some constitutional elements according to one exemplary embodiment may be replaced with constitutional elements according to another exemplary embodiment, and constitutional elements according to one exemplary embodiment may be added to constitutional elements according to another exemplary embodiment. Also, other constitutional elements may be added to, deleted from, or replaced with some constitutional elements according to each embodiment.

According to the present invention, even if a gas exhaust process is performed using an exhaust buffer chamber, a cleaning process can be sufficiently and satisfactorily performed on the inside of the exhaust buffer chamber.

Exemplary Embodiments of the Present Invention

Exemplary embodiments of the present invention will be supplementarily described below.

Supplementary Note 1

According to one aspect of the present invention, there is provided a substrate processing apparatus including:

a processing space configured to process a substrate placed on a substrate placing surface;

a gas supply system configured to supply gases into the processing space through a side facing the substrate placing surface;

an exhaust buffer chamber including a communication hole communicating with the processing space at least at a side portion of the processing space and a gas flow blocking wall extending in a blocking direction of the gases flowing through the communication hole;

a gas exhaust system configured to exhaust the gases supplied into the exhaust buffer chamber; and a cleaning gas supply pipe configured to supply a cleaning gas into the exhaust buffer chamber through a connection point installed between the communication hole and the gas flow blocking wall.

Supplementary Note 2

The substrate processing apparatus of Supplementary note 1, wherein the exhaust buffer chamber has a space having one sidewall serving as the gas flow blocking wall, the communication hole is disposed in another sidewall disposed opposite to the one sidewall of the space of the exhaust buffer chamber, and the space of the exhaust buffer chamber extends to surround an outer circumference of the side portion of the processing space.

Supplementary Note 3

According to another aspect of the present invention, there is provided a substrate processing apparatus including:

a processing space configured to process a substrate placed on a substrate placing surface;

a gas supply system configured to supply gases into the processing space through a side facing the substrate placing surface;

an exhaust buffer chamber including a space surrounding an outer circumference of a side portion of the processing space, the exhaust buffer chamber configured such that the gases supplied into the processing space flow into the space of the exhaust buffer chamber;

a gas exhaust system configured to exhaust the gases supplied into the exhaust buffer chamber; and a cleaning gas supply pipe communicating with the space of the exhaust buffer chamber and supply a cleaning gas into the exhaust buffer chamber.

Supplementary Note 4

The substrate processing apparatus of Supplementary note 3, wherein a connection point which communicates with the space of the exhaust buffer chamber is installed in the cleaning gas supply pipe between a communication hole serving as a gas flow path from the processing space to the exhaust buffer chamber and a sidewall of an outer circumferential side of the space of the exhaust buffer chamber.

Supplementary Note 5

The substrate processing apparatus of any one of Supplementary notes 1 through 4, wherein the cleaning gas supply pipe is connected to the exhaust buffer chamber at a plurality of the connection point or connected to the exhaust buffer chamber via a series of gas supply grooves surrounding the processing space in a circumferential direction.

Supplementary Note 6

The substrate processing apparatus of any one of Supplementary notes 1 through 5, wherein the gas supply system includes an inert gas supply system configured to supply an inert gas into the processing space, and the inert gas supply system is configured to supply the inert gas into the processing space before the cleaning gas is supplied into the exhaust buffer chamber through the cleaning gas supply pipe or simultaneously with the cleaning gas.

Supplementary Note 7

The substrate processing apparatus of any one of Supplementary notes 1 through 6, wherein the gas supply system further includes a processing space cleaning gas supply system configured to supply the cleaning gas into the processing space, the substrate processing apparatus further including a controller configured to control the gas supply system to perform a first cleaning process of supplying the cleaning gas through the cleaning gas supply pipe into the exhaust buffer chamber and a second cleaning process of supplying the cleaning gas through the processing space cleaning gas supply system into the processing space.

Supplementary Note 8

The substrate processing apparatus of Supplementary note 7, wherein the controller is configured to control the gas supply system in a manner that the first cleaning process is performed more frequently than the second cleaning process.

Supplementary Note 9

The substrate processing apparatus of Supplementary note 7 or Supplementary note 8, wherein the cleaning gas supplied in the first cleaning process is less active than the cleaning gas supplied in the second cleaning process.

Supplementary Note 10

The substrate processing apparatus of any one of Supplementary notes 7 through 9, further including a heater embedded in the substrate placing surface and serving as a heating source, wherein the controller is configured to turn on and turn off the heater, and the controller is configured to turn on the heater in the second cleaning process.

Supplementary Note 11

According to still another aspect of the present invention, there is provided a method of manufacturing a semiconductor device, including:

(a) processing a substrate placed on a substrate placing surface in a processing space by supplying gases onto the substrate in the processing space through a side facing the substrate placing surface while exhausting the gases from the processing space using an exhaust buffer chamber including a space surrounding an outer circumference of a side portion of the processing space; and (b) cleaning and inside of the exhaust buffer chamber by supplying a cleaning gas into the exhaust buffer chamber through a cleaning gas supply pipe communicating with the space of the exhaust buffer chamber.

Supplementary Note 12

The method of Supplementary note 11, wherein in step (b), the inert gas is supplied into the processing space through the side facing the substrate placing surface before the cleaning gas is supplied into the exhaust buffer chamber through the cleaning gas supply pipe or at latest simultaneously with the cleaning gas.

Supplementary Note 13

The method of Supplementary note 11 or Supplementary note 12, further comprising: (c) cleaning the inside of the processing space by supplying the cleaning gas into the processing space through the side facing the substrate placing surface without the substrate on the substrate placing surface, wherein the step (b) is more frequently performed than the step (c).

Supplementary Note 14

According to yet another aspect of the present invention, there is provided a program that causes a computer to perform sequences of:

(a) processing a substrate placed on a substrate placing surface in a processing space by supplying gases onto the substrate in the processing space through a side facing the substrate placing surface while exhausting the gases from the processing space using an exhaust buffer chamber including a space surrounding an outer circumference of a side portion of the processing space; and (b) cleaning and inside of the exhaust buffer chamber by supplying a cleaning gas into the exhaust buffer chamber through a cleaning gas supply pipe communicating with the space of the exhaust buffer chamber.

What is claimed is:

1. A substrate processing apparatus comprising:
    a processing space configured to process a substrate placed on a substrate placing surface;
    a gas supply system configured to supply gases into the processing space through a side facing the substrate placing surface;
    an exhaust buffer chamber including a communication hole communicating with the processing space at least at a side portion of the processing space and a gas flow blocking wall extending in a blocking direction of the gases flowing through the communication hole;
    a gas exhaust system configured to exhaust the gases supplied into the exhaust buffer chamber; and
    a cleaning gas supply pipe configured to supply a cleaning gas into the exhaust buffer chamber through a connection point installed between the communication hole and the gas flow blocking wall.

2. The substrate processing apparatus of claim 1, wherein the exhaust buffer chamber includes a space surrounding an outer circumference of the side portion of the processing space, and guides the gases supplied into the processing space to flow into the space of the exhaust buffer chamber.

3. The substrate processing apparatus of claim 2, wherein the cleaning gas supply pipe is connected to the exhaust buffer chamber at a plurality of the connection point or connected to the exhaust buffer chamber via a series of gas supply grooves surrounding the processing space in a circumferential direction.

4. The substrate processing apparatus of claim 3, wherein the gas supply system includes an inert gas supply system configured to supply an inert gas into the processing space,
    wherein the inert gas supply system is configured to supply the inert gas into the processing space before the cleaning gas is supplied into the exhaust buffer chamber through the cleaning gas supply pipe or simultaneously with the cleaning gas.

5. The substrate processing apparatus of claim 4, further comprising a controller configured to control the gas supply system, wherein the gas supply system further comprises a processing space cleaning gas supply system configured to supply the cleaning gas into the processing space, and the controller is configured to control the gas supply system to perform a first cleaning process of supplying the cleaning gas through the cleaning gas supply pipe into the exhaust buffer chamber and a second cleaning process of supplying the cleaning gas through the processing space cleaning gas supply system into the processing space in a manner that the first cleaning process is performed more frequently than the second cleaning process.

6. The substrate processing apparatus of claim 5, wherein the cleaning gas supplied in the first cleaning process is less active than the cleaning gas supplied in the second cleaning process.

7. The substrate processing apparatus of claim 5, further comprising a heater embedded in the substrate placing surface and serving as a heating source,
    wherein the controller is configured to turn on and turn off the heater, and
    the controller is configured to turn on the heater in the second cleaning process.

8. The substrate processing apparatus of claim 1, wherein the cleaning gas supply pipe is connected to the exhaust buffer chamber at a plurality of the connection point or connected to the exhaust buffer chamber via a series of gas supply grooves surrounding the processing space in a circumferential direction.

9. The substrate processing apparatus of claim 8, wherein the gas supply system includes an inert gas supply system configured to supply an inert gas into the processing space,
wherein the inert gas supply system is configured to supply the inert gas into the processing space before the cleaning gas is supplied into the exhaust buffer chamber through the cleaning gas supply pipe or simultaneously with the cleaning gas.

10. The substrate processing apparatus of claim 9, further comprising a controller configured to control the gas supply system, wherein the gas supply system further comprises a processing space cleaning gas supply system configured to supply the cleaning gas into the processing space, and the controller is configured to control the gas supply system to perform a first cleaning process of supplying the cleaning gas through the cleaning gas supply pipe into the exhaust buffer chamber and a second cleaning process of supplying the cleaning gas through the processing space cleaning gas supply system into the processing space in a manner that the first cleaning process is performed more frequently than the second cleaning process.

11. The substrate processing apparatus of claim 10, wherein the cleaning gas supplied in the first cleaning process is less active than the cleaning gas supplied in the second cleaning process.

12. The substrate processing apparatus of claim 1, wherein the gas supply system includes an inert gas supply system configured to supply an inert gas into the processing space,
wherein the inert gas supply system is configured to supply the inert gas into the processing space before the cleaning gas is supplied into the exhaust buffer chamber through the cleaning gas supply pipe or simultaneously with the cleaning gas.

13. The substrate processing apparatus of claim 12, further comprising a controller configured to control the gas supply system, wherein the gas supply system further comprises a processing space cleaning gas supply system configured to supply the cleaning gas into the processing space, and the controller is configured to control the gas supply system to perform a first cleaning process of supplying the cleaning gas through the cleaning gas supply pipe into the exhaust buffer chamber and a second cleaning process of supplying the cleaning gas through the processing space cleaning gas supply system into the processing space in a manner that the first cleaning process is performed more frequently than the second cleaning process.

14. The substrate processing apparatus of claim 12, wherein the cleaning gas supplied in the first cleaning process is less active than the cleaning gas supplied in the second cleaning process.

15. The substrate processing apparatus of claim 12, further comprising a heater embedded in the substrate placing surface and serving as a heating source,
wherein the controller is configured to turn on and turn off the heater, and
the controller is configured to turn on the heater in the second cleaning process.

16. The substrate processing apparatus of claim 1, further comprising a controller configured to control the gas supply system, wherein the gas supply system further comprises a processing space cleaning gas supply system configured to supply the cleaning gas into the processing space, and the controller is configured to control the gas supply system to perform a first cleaning process of supplying the cleaning gas through the cleaning gas supply pipe into the exhaust buffer chamber and a second cleaning process of supplying the cleaning gas through the processing space cleaning gas supply system into the processing space in a manner that the first cleaning process is performed more frequently than the second cleaning process.

17. The substrate processing apparatus of claim 16, wherein the cleaning gas supplied in the first cleaning process is less active than the cleaning gas supplied in the second cleaning process.

18. The substrate processing apparatus of claim 16, further comprising a heater embedded in the substrate placing surface and serving as a heating source,
wherein the controller is configured to turn on and turn off the heater, and
the controller is configured to turn on the heater in the second cleaning process.

\* \* \* \* \*